United States Patent [19]

Takahashi

[11] Patent Number: 4,747,570

[45] Date of Patent: May 31, 1988

[54] MOUNT FOR ELECTRONIC INSTRUMENT

[75] Inventor: Masumi Takahashi, Tokyo, Japan

[73] Assignee: NEC Corporation, Japan

[21] Appl. No.: 25,227

[22] Filed: Mar. 12, 1987

[30] Foreign Application Priority Data

Mar. 17, 1986 [JP] Japan .............................. 61-39272[U]

[51] Int. Cl.⁴ .............................................. A47G 29/30
[52] U.S. Cl. ................................. 248/309.1; 248/346;
220/8; 206/1.5
[58] Field of Search ........... 248/309.1, 316.4, DIG. 6,
248/360, 176, 346; 206/1.5; 220/8

[56] References Cited

U.S. PATENT DOCUMENTS 4,098,423 7/1978 Marrero .................... 248/DIG. 6 X
4,216,857 8/1980 Huang ................................. 206/1.5
4,561,544 12/1985 Reeve ............................. 206/1.5 X
4,612,603 9/1986 Cook ........................ 248/DIG. 6 X
4,627,589 12/1986 Hotsumi .............................. 248/346

FOREIGN PATENT DOCUMENTS 2042476 9/1980 United Kingdom .................... 220/8

Primary Examiner—Ramon S. Britts
Assistant Examiner—Karen J. Chotkowski
Attorney, Agent, or Firm—Laff, Whitesel, Conte & Saret

[57] ABSTRACT

A mount for securing an electronic instrument to a desired wall of a luggage compartment of an automotive vehicle such as a top or a side wall. As a housing of the instrument is slid into a generally U-shaped metal fixture with its guide grooves mated with guide pieces which are provided on both ends of "U" of the fixture, hooks positioned at both sides of the fixture are brought into locking engagement with recesses which are provided on the housing of the instrument, whereby the housing is locked to the fixture. Biased by a spring outward, the housing may be unlocked from the fixture simply by pulling a handle which is positioned at one side of the fixture.

9 Claims, 3 Drawing Sheets

MOUNT FOR ELECTRONIC INSTRUMENT

BACKGROUND OF THE INVENTION

The present invention relates to a mounting device and, more particularly, to a mount usable to secure an electronic instrument to a desired wall of of a luggage compartment of an automotive vehicle, e.g. a top wall or a side wall.

A prior art mount of the kind described is implemented with a metal fixture which is provided with guide pieces, and a housing of an electronic instrument which is provided with guide grooves. While the metal fixture is fastened to, for example, the ceiling or a side wall of a luggage compartment of an automotive vehicle by screws and other suitable fastening means, the instrument housing is secured to the metal fixture by screws or the like with its guide grooves individually mated with the guide pieces of the metal fixture. A drawback with such a prior art implementation is that the instrument cannot be mounted or dismounted without a screwdriver and other tools due to the screw type fixing system. This results in poor manipulatory efficiency and, therefore, consumes a substantial period of time for mounting and dismounting, especially in a limited space available in an automotive vehicle. Another drawback is that seats for the screws which protrude from both sides of the instrument housing are not only obstructive to the manipulation but also detrimental to the appearance.

SUMMARY OF THE INVENTION

It is therefore an object of the present invention to provide a mount which allows the housing of an electronic instrument to be readily mounted to and dismounted from a metal fixture.

It is another object of the present invention to provide a generally improved mount for an electronic instrument.

A mount for an electronic instrument of the present invention comprises a housing of the instrument having a guide groove and a locking recess at each of both sides thereof, a generally U-shaped metal fixture for accommodating the housing of the equipment therein, the metal fixture being provided with guide pieces each being engageable with a respective one of the guide grooves, hooks provided on the metal fixture and each being engageable with a respective one of the locking recesses when the housing is accommodated in the metal fixture, each of the hooks being applied with a spring bias to prevent the housing from slipping out of the metal fixture, levers each for urging a respective one of the hooks in a direction for overcoming the spring bias, and a mechanism for applying a spring bias to the housing in a direction for removing the housing from the metal fixture when the spring biases acting on the hooks are overcome by the levers.

The above and other objects, features and advantages of the present invention will become more apparent from the following detailed description taken with the accompanying drawings.

DESCRIPTION OF THE PREFERRED EMBODIMENT

Figure 1:
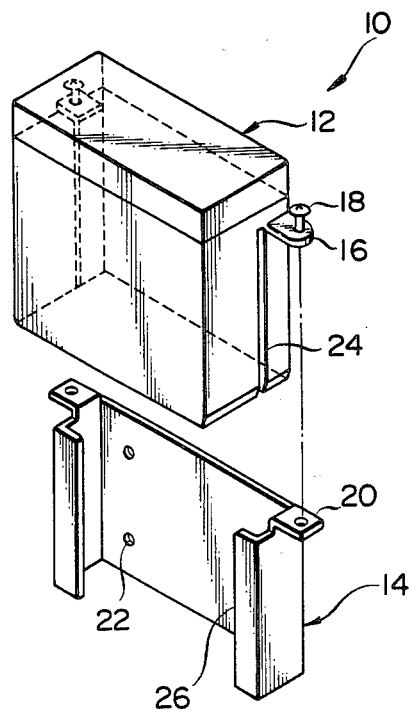
FIG. 1 is a perspective view of a prior art mount for an electronic instrument.

To better understand the present invention, a brief reference will be made to a prior art mount for an electronic instrument, shown in FIG. 1. As shown, the prior art mount, generally 10, consists of a housing 12 of an electronic instrument and a metal fixture 14. The housing 12 is provided with seats 16 for screws 18 on both sides thereof. The metal fixture 14, on the other hand, is provided with lugs 20 each being formed with a screw hole which aligns with one of the seats 16 of the housing 12. The metal fixture 14 is secured to a desired wall, e.g., a top wall or a side wall of a luggage compartment of an automotive vehicle through openings 22, which are formed through the metal fixture 14. Specifically, an electronic instrument is fixed to the wall of a luggage compartment by mating each of the guide grooves 24 of the housing 12 with a repective one of the guide pieces 26 of the metal fixture 14, then aligning the seats 16 of the housing 12 and the lugs 20 of the metal fixture 14, and then driving the screws 18.

As previously states, the fixing system which relies on screws brings about the need for a screwdriver and other tools in mounting and dismounting a desired instrument. Considering a limited space available in an automotive vehicle, such manipulation is poor in efficiency and time-consuming. Further, the seats 16 which protrude sideways from the housing 12 obstruct the manipulation and detriment the appearance.

Figure 2:
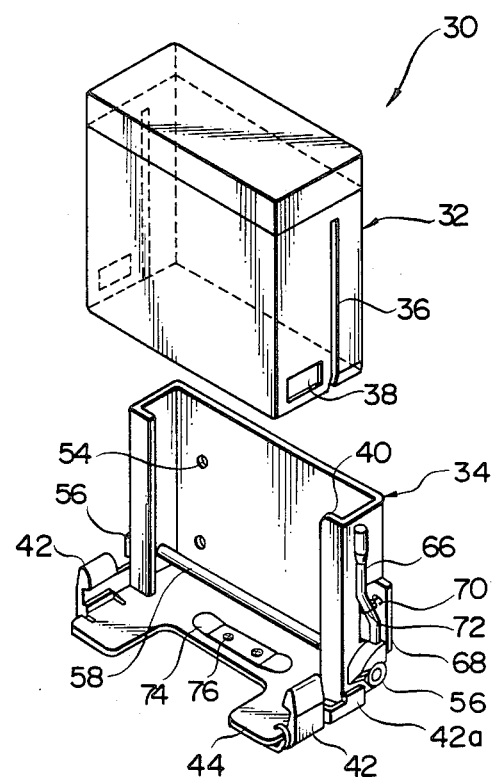
FIG. 2 is a perspective view of a mount embodying the present invention.
Figure 3:
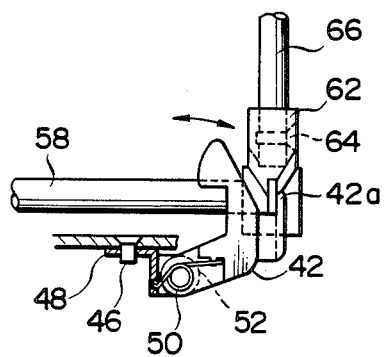
FIGS. 3 and 4 are a section and a perspective view each showing a rotatable portion of the mount as shown in FIG. 2.
Figure 4:
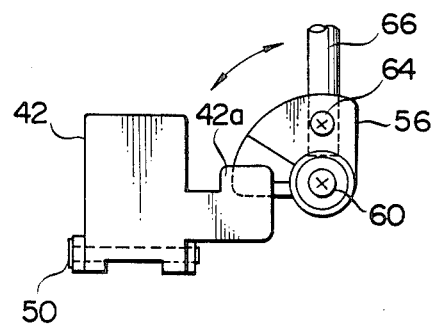

Referring to FIGS. 2 to 4, a mount embodying the present invention and which is free from the drawbacks discussed above is shown and generally designated by the reference numeral 30. The mount 30 is shown as comprising a housing 32 of an electronic instrument and a metal fixture 34. The housing 32 is provided with a guide groove 36 and a locking recess 38 at each of both sides thereof. On the other hand, the metal fixture 34 is provided with guide pieces 40 which are individually engageable with the guide grooves 36 of the housing 32. As shown, the metal fixture 34 is generally U-shaped so that the housing 32 may be slid into the metal fixture 34 to settle in a predetermined position, as will be described. When the housing 32 is slid downward with its guide grooves 36 mated with the guide pieces 40 of the metal fixture 34, hooks 42 which are provided on the metal fixture 34 are individually brought into engagement with the locking recesses 38 of the housing 32. Specifically, as shown in FIGS. 3 and 4, each of the hooks 42 is rotatably supported through a pin 50 by a metal bracket 48 which is in turn fastened by screws 46 to that end portion 44 (FIG. 2) of the fixture 34 which is perpendicular to the guide piece 40. The hook 42 is constantly biased by a spring 52 toward the inside of the metal fixture 34. When mated with the recesses 38 of the housing 32, the hooks 42 prevent the housing 32 from slipping out of the metal fixture 34. The fixture 32 is fastened to a side wall or the like of a vehicle luggage compartment by, for example, screws which may be passed through the openings 54 of the fixture 34.

To release the hooks 42 from the recesses 38, the metal fixture 34 is provided with levers 56 at both sides thereof. As best shown in FIG. 4, each lever 56 is sector-shaped and mounted by a screw 60 to a rotatable shaft 58, which extends throughout both sides of the metal fixture 34. The tip, or actuating edge, of the lever 56 is tapered by a predetermined angle so that, when the lever 56 is rotated counterclockwise as viewed in FIG. 4, the actuating edge urges a projection 42a of the hook 42 away from the side of the fixture 34 (rightward as viewed in FIG. 3). One of the levers 56 is provided with a handle 66 which is received in a bore 62 and fixed therein by a screw 64. A coil spring 70 is anchored at one end to the handle 66 and at the other end to a lug 68, which is provided on and perpendicular to the side of the fixture 34. The coil spring 70 constantly biases the handle 66 clockwise as viewed in FIG. 4. To anchor the spring 70, the handle 66 is formed with a groove 72 at an intermediate portion thereof. A leaf spring 74 is fastened by screws 76 to the bottom of the fixture 34 in order to bias the housing 32 upward when the housing 32 is inserted in the metal fixture 34.

To fix the housing 32 to the metal fixture 34, the housing 32 is simply slid into the fixture 34 with the guide grooves 36 mated with the guide pieces 40, until the hooks 42 is brought into locking engagement with the recesses 38 against the action of the springs 52. To remove the housing 32 from the fixture 34, the handle 66 is pulled toward the hooks 42 against the action of the spring 70, causing each lever 56 to urge its associated hook 42 out of the recess 38. Then, the housing 32 is raised by the leaf spring 74 and now ready to be removed from the fixture 34. Even after the handle 66 has been released, the hooks 42 are prevented from locking the housing 32 again unless an effort great enough to overcome the biasing forces of the springs 52 is applied from the above.

In summary, it will be seen that the present invention provides a mount which allows an electronic instrument to be locked to a metal fixture simply by inserting a housing of the instrument into the fixture with its guide grooves mated with guide pieces of the latter. To unlock the instrument, all that is required is pulling a handle toward a person who is manipulating the mount. Further, the mount which has no projections is desirable in the aspect of appearance and space requirement.

Various modifications will become possible for those skilled in the art after receiving the teachings of the present disclosure without departing from the scope thereof.

What is claimed is:

1. A mount for an electronic instrument, comprising:
   a housing for said instrument having a guide groove and a locking recess at each of both sides thereof;
   a generally U-shaped metal fixture for accommodating said housing of said equipment therein, said metal fixture being provided with guide pieces, each of said guide pieces being engagable with a respective one of said guide grooves;
   hooks provided on said metal fixture, each of said hooks engaging a respective one of said locking recesses when said housing is accommodated in said metal fixture, each of said hooks having a spring bias to latch into said recesses for preventing said housing from slipping out of said metal fixture;
   a lever associated with each of said hooks for urging an associated one of said hooks in a direction for overcoming said spring bias to release said latch; and
   a mechanism for applying a spring bias to said housing in a direction for removing said housing from said metal fixture when said spring biases acting on said hooks are overcome by an operation of said levers.

2. A mount for installing and holding an instrument in a vehicle, said mount comprising a housing and a fixture plate having first spring biased means for urging said housing and plate to separate from each other, means for enabling said housing and plate to move together and into a closed position against the urging of said first spring bias or to separate under the urging of said first spring bias, latch means urged by a second spring bias for securing said housing to said plate in said closed position, and lever means for releasing said latch means against the urging of said second spring bias, whereby said housing and plate separate under said first spring bias.

3. The mount of claim 2 wherein said means for enabling said housing and plate to move together or to separate comprises guide rails for enabling them to slide relative to each other.

4. The mount of claim 3 and a leaf spring at the end of said guide rail for supplying said first spring bias to separate said housing and plate as it is unlatched.

5. The mount of claim 4 wherein said latch means is at least one leaf spring with a detent on the free end thereof, and locking recess means which encounters said detent when said housing and plate move together.

6. The mount of claim 5 wherein said lever means moves said detent out of said recess.

7. The mount of claim 6 and bolt holes in said plate for attaching said plate to a panel forming a wall in the luggage compartment of said vehicle.

8. The mount of claim 6 wherein said housing contains electronic equipment.

9. The mount of claim 6 wherein said plate is attached to a panel of said vehicle and said housing contains an electronic instrument.

* * * * *